United States Patent

Nozaki

[11] Patent Number: 5,937,024
[45] Date of Patent: Aug. 10, 1999

[54] COUNTER FOR COUNTING HIGH FREQUENCY

[75] Inventor: Akihiro Nozaki, Kanagawa, Japan

[73] Assignee: NEC Corporation, Tokyo, Japan

[21] Appl. No.: 09/030,780

[22] Filed: Feb. 26, 1998

[30] Foreign Application Priority Data

Feb. 27, 1997 [JP] Japan ................................ 9-044139

[51] Int. Cl.$^6$ ................................................ H03K 21/00
[52] U.S. Cl. ............................................ 377/47; 377/114
[58] Field of Search .................... 377/39, 111, 116, 377/114, 47

[56] References Cited

U.S. PATENT DOCUMENTS 4,095,093  6/1978  Miles ........................................ 377/26

FOREIGN PATENT DOCUMENTS 63-107317  5/1988  Japan .
5-136691  6/1993  Japan .

*Primary Examiner*—Margaret R. Wambach
*Attorney, Agent, or Firm*—Sughrue, Mion, Zinn, Macpeak & Seas, PLLC

[57] ABSTRACT

To implement a counter which can count clocks at high frequency exceeding the maximum operating frequency of the counter circuit, with a circuit with smaller circuit scale and lower power consumption, the present invention divides an externally set value HDB indicative of a count completion value into upper and lower bits, the upper bits being counted by using a counter circuit 12 with small circuit scale and power consumption, match being detected by a comparator 13. The clock signal is frequency divided to accommodate supply of high frequency clocks, and supplies it to the counter circuit 12. Then, the match detection signal of the upper bits is shifted in the number corresponding to the value of lower bits by a shift register 14 operating at a high frequency, and a count completion signal OUT is output.

10 Claims, 8 Drawing Sheets

COUNTER FOR COUNTING HIGH FREQUENCY

BACKGROUND OF THE INVENTION

1. Field of the Invention

The present invention relates to a counter for counting a predetermined number of clocks, and, more particularly, to a counter suitable for being incorporated in an integrated circuit using a high speed clock.

2. Description of the Related Art

There is a counter which outputs a pulse when a predetermined number of clocks is input by using a synchronized counter circuit synchronizing clocks. Such counter is widely used, for example, for generating a horizontal synchronizing signal for a display device.

FIG. 6 is a block diagram of a conventional counter counting a predetermined number of clocks. A counter 60 counts the number of clocks CLK with a counter circuit 61, and a comparator 62 compares count values (Q0–Qn) from the counter circuit 61 with externally set values HDB (HDB0–HDBn) indicative of a predetermined number, and outputs a count complete signal OUT when both value match each other. The counter circuit 61 is initialized with a reset signal RST. In addition, the comparator 62 consists of, for example, an EX-NOR circuit, and the count value (Q0–Qn) being input and the externally set value HDB (HDB0–HDBn) have the same number of bits.

Typically, a circuit shown in FIG. 7 is used for the counter circuit 61. A counter circuit 70 consists of D-type flip-flops 700–70n which are output circuits to which a clock signal CLK is commonly input, and a feedback section 71 for carrying the count value. The count value is represented by a BCD code, where Q0 is LSB, and Qn is MSB. Here, the operating frequency of this circuit mainly depends on the working speed of the feedback section 71. That is, since the feedback section 71 consists of an inverter 710, and gate circuits such as EX-OR circuits 720–72n and AND circuits 730–73n, the maximum possible operating frequency of the counter circuit 70 depends on gate delay of the gate circuits constituting the feedback section 71.

Recently, the integrate circuit is demanded for high speed operation, and the frequency becomes higher accordingly for the clock signal used in the integrated circuit. However, in the counter circuit 70, when the frequency of clock signal CLK becomes higher, carrying of the count value may late for input of the clock signal CLK due to gate delay in a feedback section 71, leading to malfunction. Therefore, recently, without using the counter circuit as in FIG. 7, it is contemplated to increase speed of the counting operation by constructing a counter only with shift registers and flip-flops. However, such counter circuit has a problem in a scale of circuit and power consumption.

SUMMARY OF THE INVENTION

Therefore, the present invention is intended to provide a counter which is suppressed for its circuit scale and power consumption, and can count high speed clock signals.

The counter according to the present invention comprises a frequency divider circuit receiving an input clock signal and dividing the input clock signal to output a divided clock signal, divider means receiving an externally set value with a predetermined number of bits and dividing the externally set value into a first externally set value with a first predetermined number of bits and a second externally set value with a second predetermined number of bits, first count comparator operating in synchronization with the divided clock signal and outputting a match detection signal when the input clock signals are input by the number of the first externally set value, and second count comparator operating in synchronization with the input clock signal and outputting a match detection signal as a count completion signal when the input clock signals are input by the number of the second externally set value.

In addition, the first count comparator includes a first counter circuit which comprises a first flip-flop and a second flip-flop to which the divided clock signal is commonly input, and a gate circuit supplying output of the first flip-flop to the second flip-flop as a carry signal, while the second count comparator includes a second counter circuit which comprises a third flip-flop and a fourth flip-flop to which the input clock signal is commonly input, and a shift register receiving the match detection signal as data input.

Furthermore, according to the present invention, the second number of bits is $\log_2 d$ where the number of frequency division of the frequency divider circuit is d. Still further, the shift register has the number of stages of $2^l - 1$ when the number of second bit is l.

With the above arrangement, the present invention implements a counter which can count clocks at high frequency exceeding the maximum operating frequency of the counter circuit, with a circuit with smaller circuit scale and lower power consumption.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENT

Figure 6:
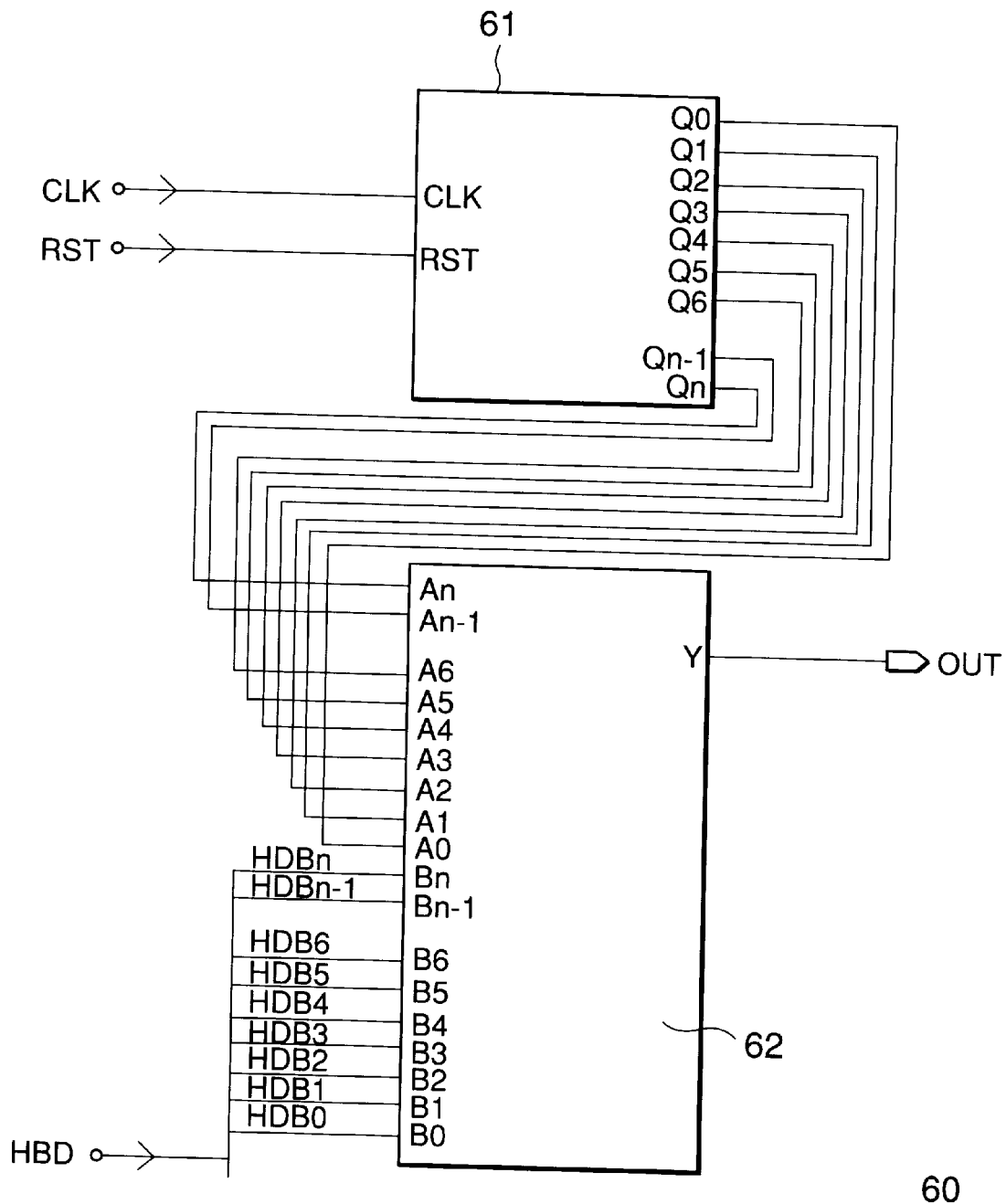
FIG. 6 is a block diagram showing a circuit configuration of a conventional counter.

Now, description is given on a high speed counter circuit which is applied as the counter circuit 61 of FIG. 6.

Figure 8:
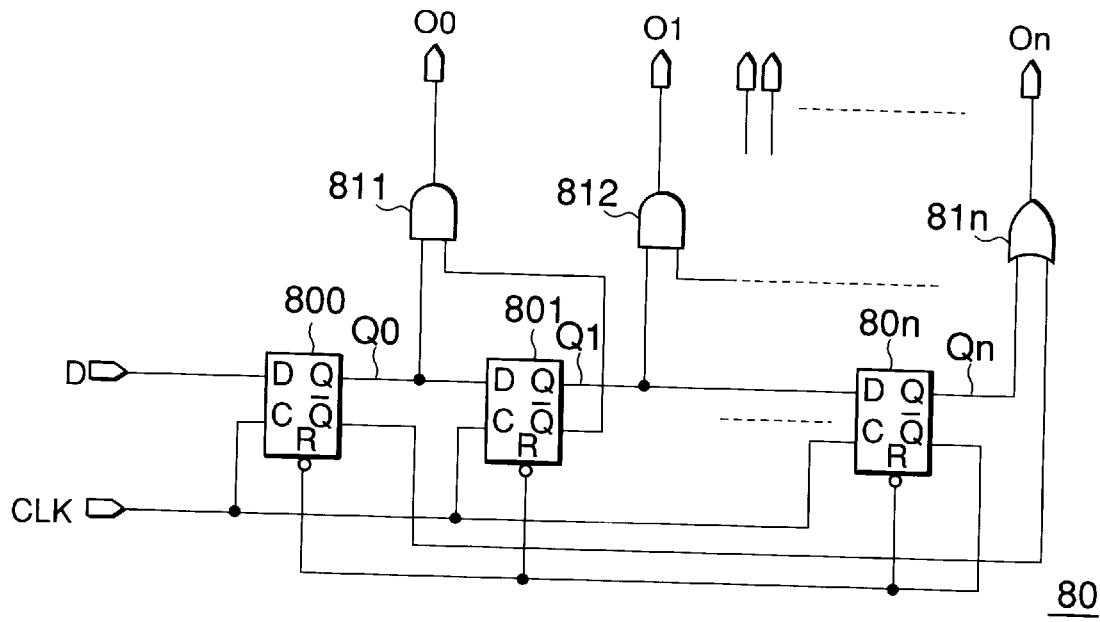
FIG. 8 is a circuit diagram showing a high speed counter circuit constituted by conventional shift registers.

FIG. 8 shows a counter circuit described in Japanese Patent Application Laid-Open No. 63-107317. A counter circuit 80 constitutes an n-array counter by constituting a shift register series connecting n flip-flops 800–80n. In operation, "1" (active level H) is input as a data signal D, and AND circuits 811, 812, . . . and an OR circuit 81n sequentially output pulses O0–On in response to input of clock signals CLK. In addition, when an output Qn of the flip-flop 80n becomes "1", its inverse output/Q initializes all the flip-flops 800–80n.

Figure 9:
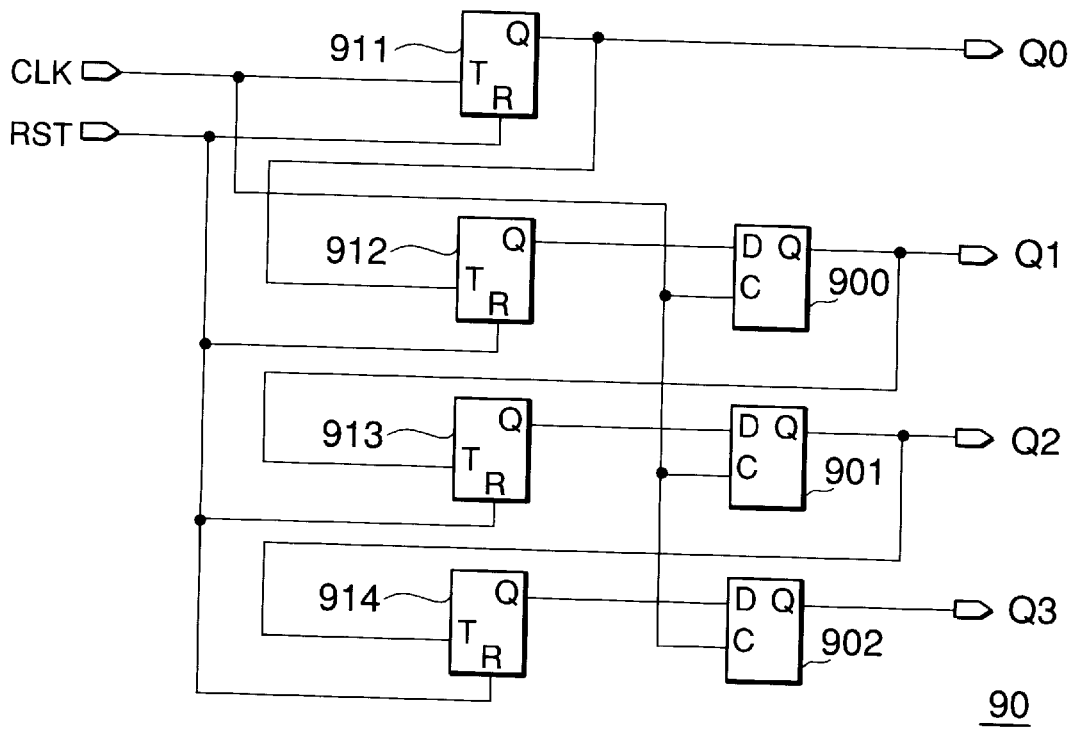
FIG. 9 is a circuit diagram showing a high speed counter circuit constituted by conventional flip-flops.

FIG. 9 shows a counter circuit described in Japanese Patent Application Laid-Open No. 5-136691. A counter circuit 90 comprises D-type flip-flops 900–902 to which a clock signal CLK is commonly input, and T-type flip-flops 911–914 constituting a feedback section. However, the feedback section is not to perform carry as the feedback section 71 of FIG. 7. That is, it does not output a count value in BCD code as in the counter circuit 70 of FIG. 7, but outputs 16 different values constituted by four bits of Q0–Q3 in response to input of the clock signal CLK.

When the counter circuit shown in FIG. 8 or 9 is used as the counter circuit 61 of FIG. 6, the following problem arises.

Figure 7:
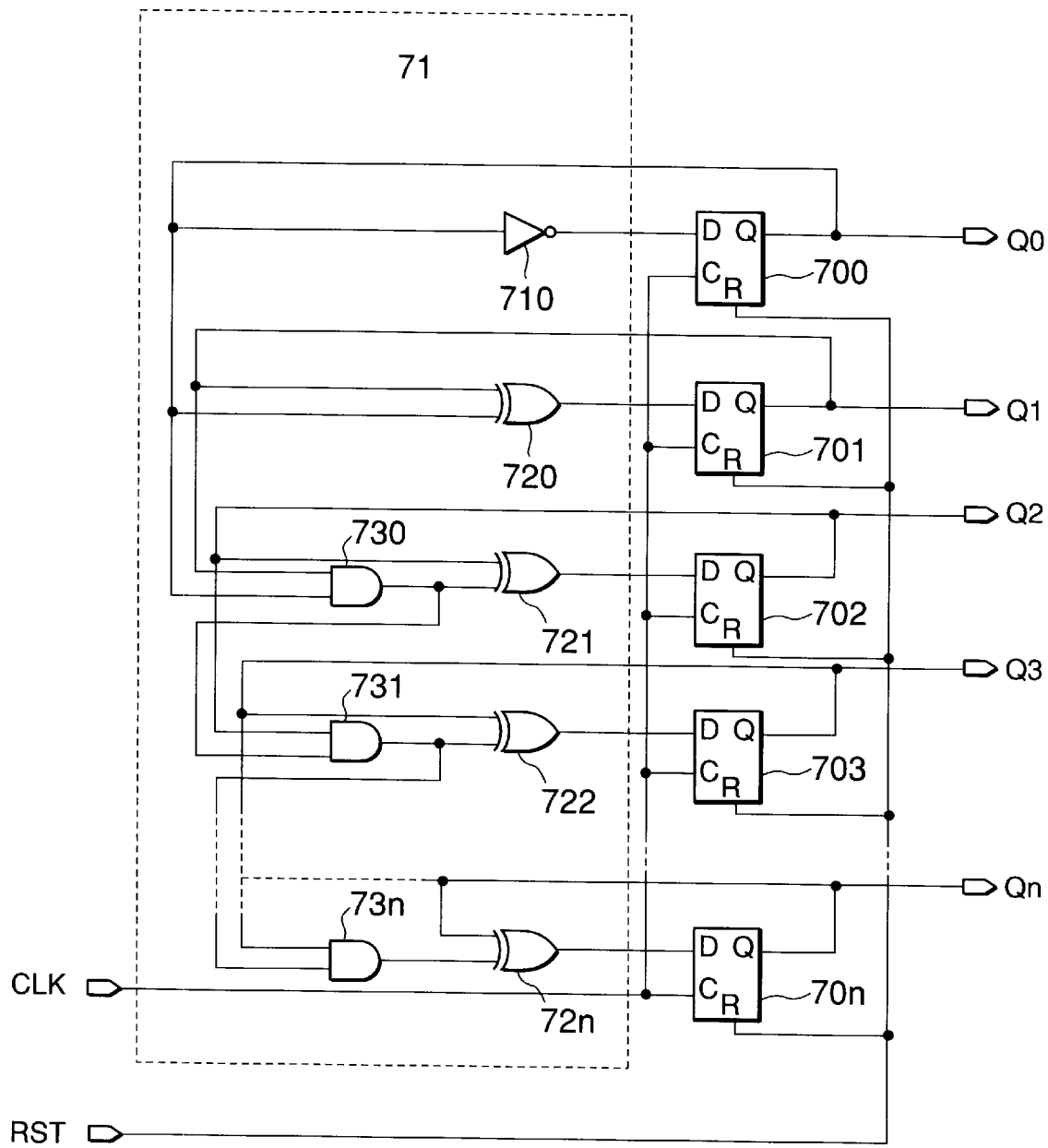
FIG. 7 is a circuit diagram showing a counter circuit used in the present invention.

When, for example, a 256-array counter circuit is assumed, the counter circuit 70 of FIG. 7 is constituted by eight D-type flip-flops and a corresponding feedback section. On the other hand, the counter circuit 80 of FIG. 8 required 256 flip-flops and gate circuits. Accordingly, increase of circuit scale including comparators causes a problem. In addition, since all flip-flops operate in synchronization with high speed clock signals, power consumption also increases. Furthermore, in the counter circuit 90 of FIG. 9, although the number of flip-flops is less than that in the counter circuit 70 of FIG. 7 by one, since the feedback section is constituted by the T-type flip-flops, the counter circuit 90 requires gate circuits several times those in the feedback section 71 of FIG. 7, which increases the circuit scale and power consumption.

Figure 1:
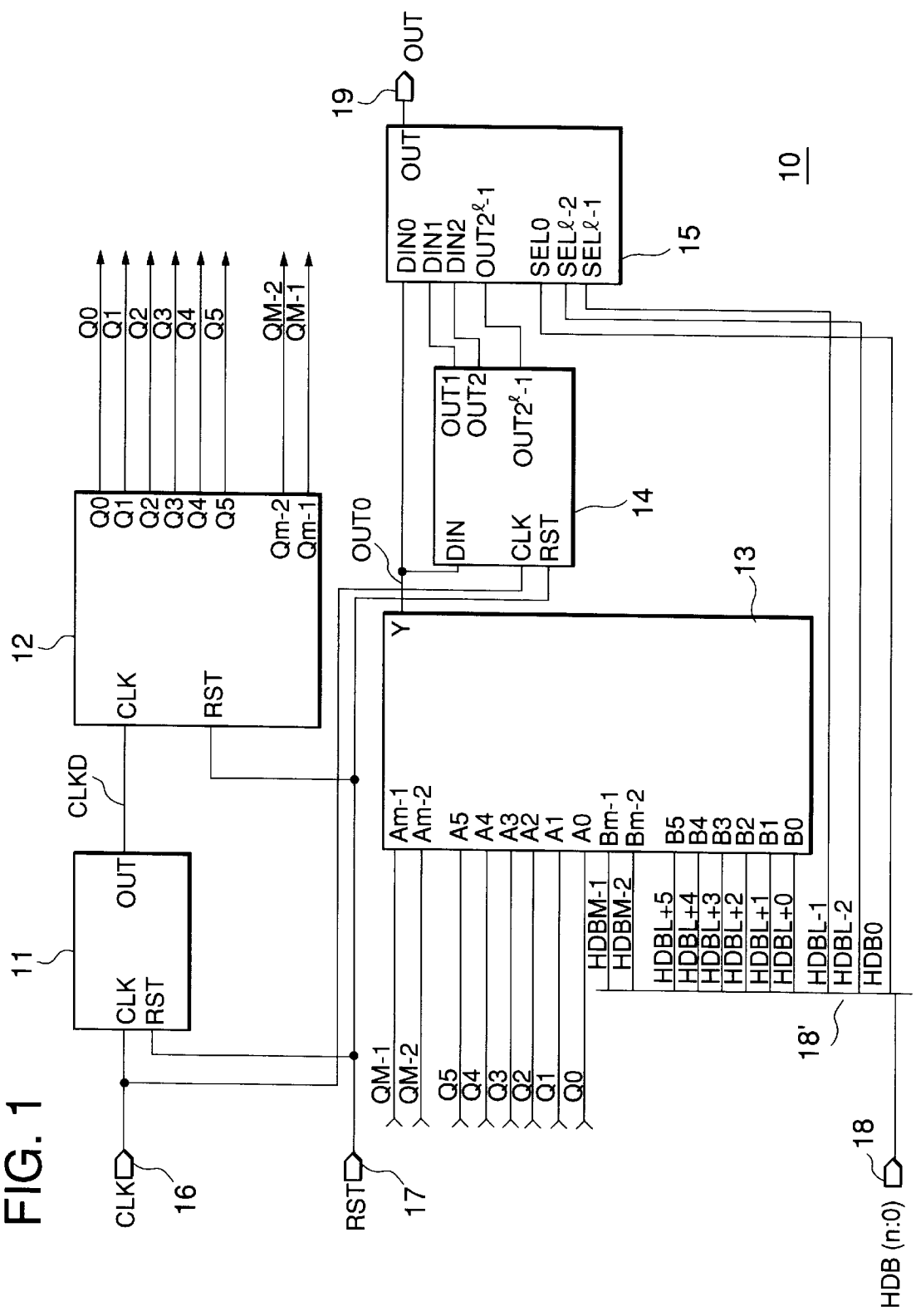
FIG. 1 is a block diagram showing a circuit configuration of an embodiment according to the present invention.

Now, the counter of the present invention is described with reference to FIG. 1. The present invention uses as the counter circuit 12 the counter circuit of FIG. 7 which has a smaller circuit scale and lower power consumption. Then, for causing the counter circuit 12 to accommodate a high speed clock signal CLK, the clock signal CLK input from a clock input terminal 16 (hereinafter called an "original clock signal") is frequency divided by a frequency divider circuit 11, and supplied to the counter circuit 12. If the frequency divided clock signal CLKD is assumed to be the maximum possible operating frequency of the counter circuit 12, the original clock signal CLK supplied to a counter 10 can have a frequency several times higher than the frequency divided clock signal CLKD.

According to the present invention, counting operation is performed by dividing bits into upper bits and lower bits. That is, if the externally set value HDB indicative of a predetermined number consists of n (=upper m+lower l), the upper m bits (0–m−1) is counted by the counter circuit 12, while the lower l bits (0–l−1) is counted by a shift register 14. The number of lower bits l is found as l=$\log_2 d$ where d is the number of frequency division. The frequency division ratio is desirable to be the factorial two. For example, if the original clock signal CLK is frequency divided by two, l=1, if it is divided by four, l=2, and if it is divided by eight, l=3. In this case, the number of stages of the shift register 14 can be found by $2^l-1$.

The externally set value HDB is divided by divider means 18', and the upper bits HDBL+0–HDBM−1 and the lower bits HDB0–HDBL−1 are input into a comparator 13 and a multiplexer 15, respectively. Therefore, the comparator 13 compares HDBL+0–HDBM−1 (m bits) of the externally set value HDB with the count values of the counter circuit 12 Q0–QM−1 (m bits), and outputs a match detection signal OUT0 from an output terminal Y when both values match each other. Here, the comparator 13 consists of, for example, a two-input EX-NOR circuit to one of which inputs output Q of the counter circuit is supplied, and to the other of which inputs the externally set value HDB is input. Therefore, when the count values Q0–QM−1 match the externally set values HDBL+0–HDBM−1, the match detection signal OUT0 becomes "1" (active level H), while, when they fail to match, it becomes "0" (inactive level L).

When the match detection signal OUT0 is output, it is shifted by the shift register 14 based on the original clock signal CLK to generate retiming signals OUT1–OUT$2^l$−1. These signals OUT1–OUT$2^l$−1 correspond to count values of the original clock signal CLK. The generated match detection signals OUT1–OUT$2^l$−1 are input into the multiplexer 15, and one of them is selected by the lower bit l of the externally set value HDB, and output as a count completion signal OUT. That is, the shift register 14 substantially behaves as a counter circuit for the lower bits, while the multiplexer 15 substantially behaves as a comparator for the lower bits.

Figure 2:
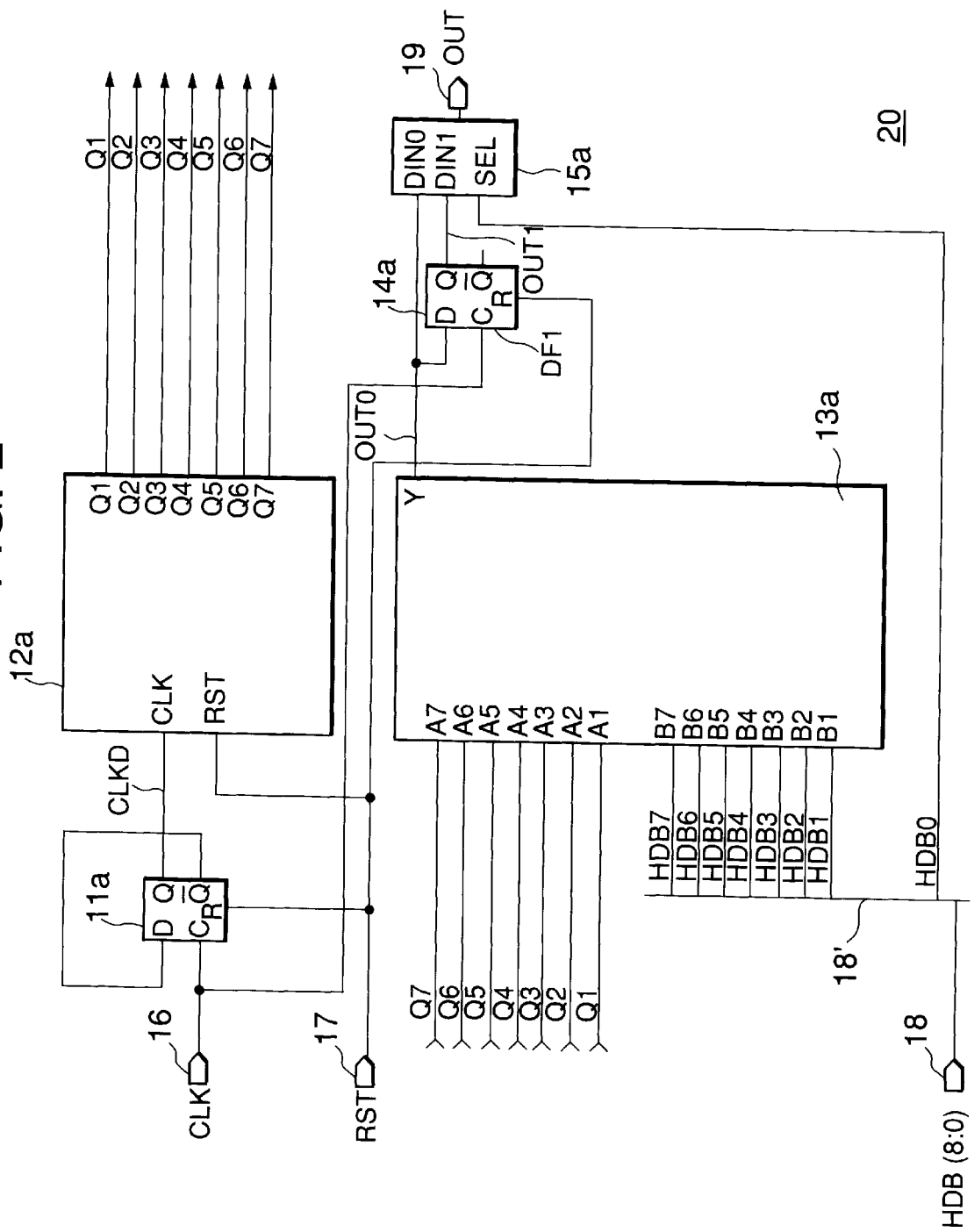
FIG. 2 is a circuit diagram showing a first embodiment of the present invention.

Specific embodiments of the present invention are described. A first embodiment is arranged as shown in FIG. 2. The embodiment is a counter which can count up to eight bits, that is, can count original clock signals CLK from 0 to 255. The counter 20 bi-frequency divides the original clock signal CLK with a bi-frequency divider 11a to generate the frequency divided clock signal CLKD. That is, when the frequency divided clock signal CLKD is of f MHz, the original clock signal CLK is 2f MHz. Since the dividing frequency d is two, the number of lower bits l is one, and the number of stages of the shift register is also one. Therefore, a counter circuit 12a is arranged to output count values Q1–Q7 of seven bits. Then, a comparator 13a compares the count values Q1–Q7 with the upper seven bits HDB1–HDB7 of the externally set value HDB. Since the shift register 14a is sufficient to have one stage, it is constituted by one flip-flop DF1. The flip-flop DF1 performs retiming of a match detection signal OUT0 from the comparator 13a with the original clock signal CLK to output it as a match detection signal OUT1. A multiplexer 15a receives the match detection signals OUT0 and OUT1 at data input terminals DIN0 and DIN1 as inputs, respectively. These match detection signals OUT0 and OUT1 are selected by the lower bit HDB0 of the externally set value HDB. That is, the externally set value HDB0 is input into a select terminal SEL of the multiplexer 15a, and the match detection signal OUT0 is selected when the externally set value HDB0="0", and the match detection signal OUT1 is selected when the externally set value HDB0="1" and output as the count completion signal OUT.

Figure 3:
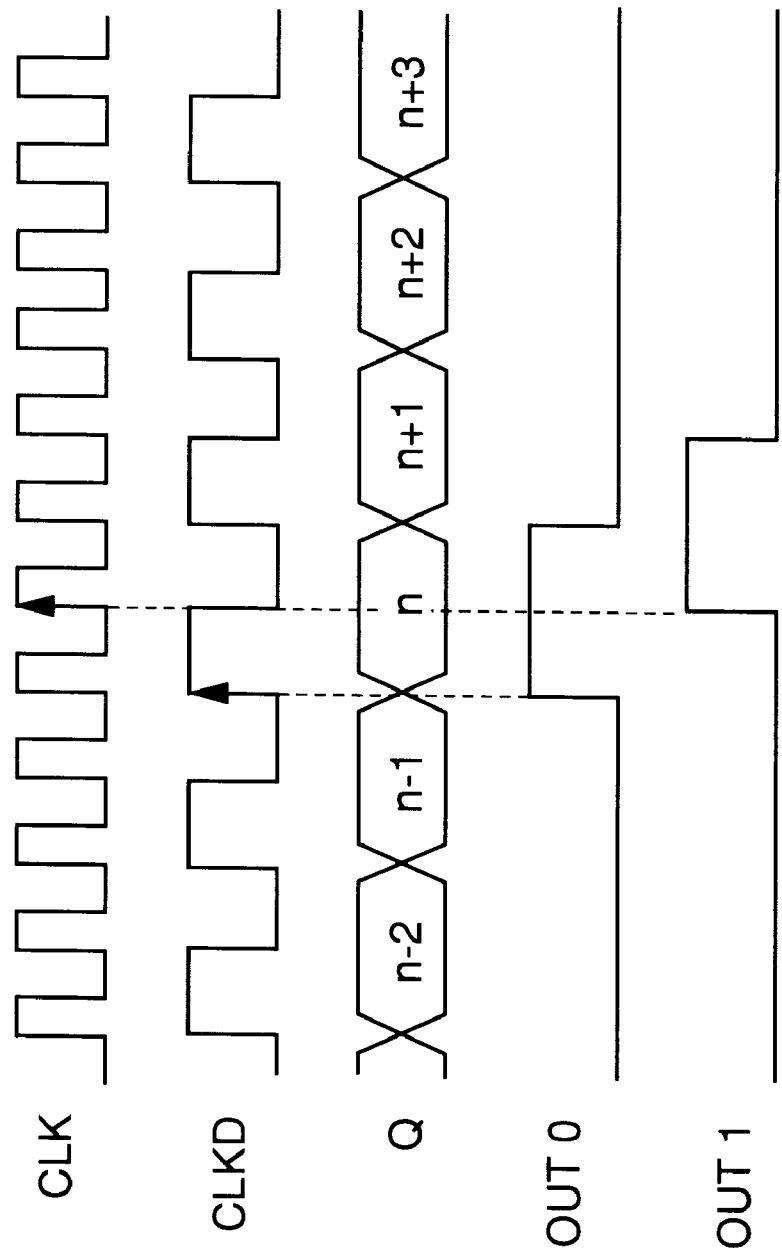
FIG. 3 is a timing chart showing operation of the first embodiment of the present invention.

FIG. 3 shows a timing chart. In the case of the embodiment, since the lower bit HDB0 of the externally set value is the least significant bit, the externally set value is even when "0" is set, and odd when "1" is set. Output of the counter circuit 12a varies at the even clock of the original clock signal CLK because the frequency divided clock signal CLKD is a bi-frequency divided signal of the original clock signal CLK. Therefore, when the match detection signal OUT0 is generated at the moment when the upper bits HDB1–HDB7 of the externally set value match each other, the match detection signal OUT0 becomes the count completion signal OUT at the multiplexer 15a if the least significant bit HDB0 is "0". On the other hand, if the least significant bit HDB0 is "1", the flip-flop DF1 causes the match detection signal OUT0 to match the odd clock of the original clock signal CLK. In such way, the retimed match detection signal OUT1 is made the count completion signal OUT. In other words, the match detection signal OUT0 with an even value is shifted by one clock to make it a match detection signal corresponding to an odd value.

Returning to FIG. 2, a specific value is discussed. For example, it is assumed that a count completion signal OUT is output when there are 255 original clock signals CLK. In this case, the externally set values HDB0–HDB7 are set as "11111111". Therefore, the comparator 13a generates the match detection signal OUT0 when outputs Q1–Q7 of the counter circuit 12a becomes "11111111 (127)". Here, since the counter circuit 12a is counting at a bi-frequency divided clock CLKD, when the outputs Q1–Q7 indicate "127", the original clock signal CLK is "254". Since the least significant bit HDB0 of the externally set value is now "1", when the 255-th original clock signal CLK is generated, the multiplexer 15a selects the match detection signal OUT1 output by the flip-flop DF1, and outputs the count completion signal OUT.

As described above, even if a counter circuit 12a not accommodating high frequency is used, the present invention can accurately count the number of high speed original clock CLK exceeding the maximum possible operating frequency of the counter circuit.

Figure 4:
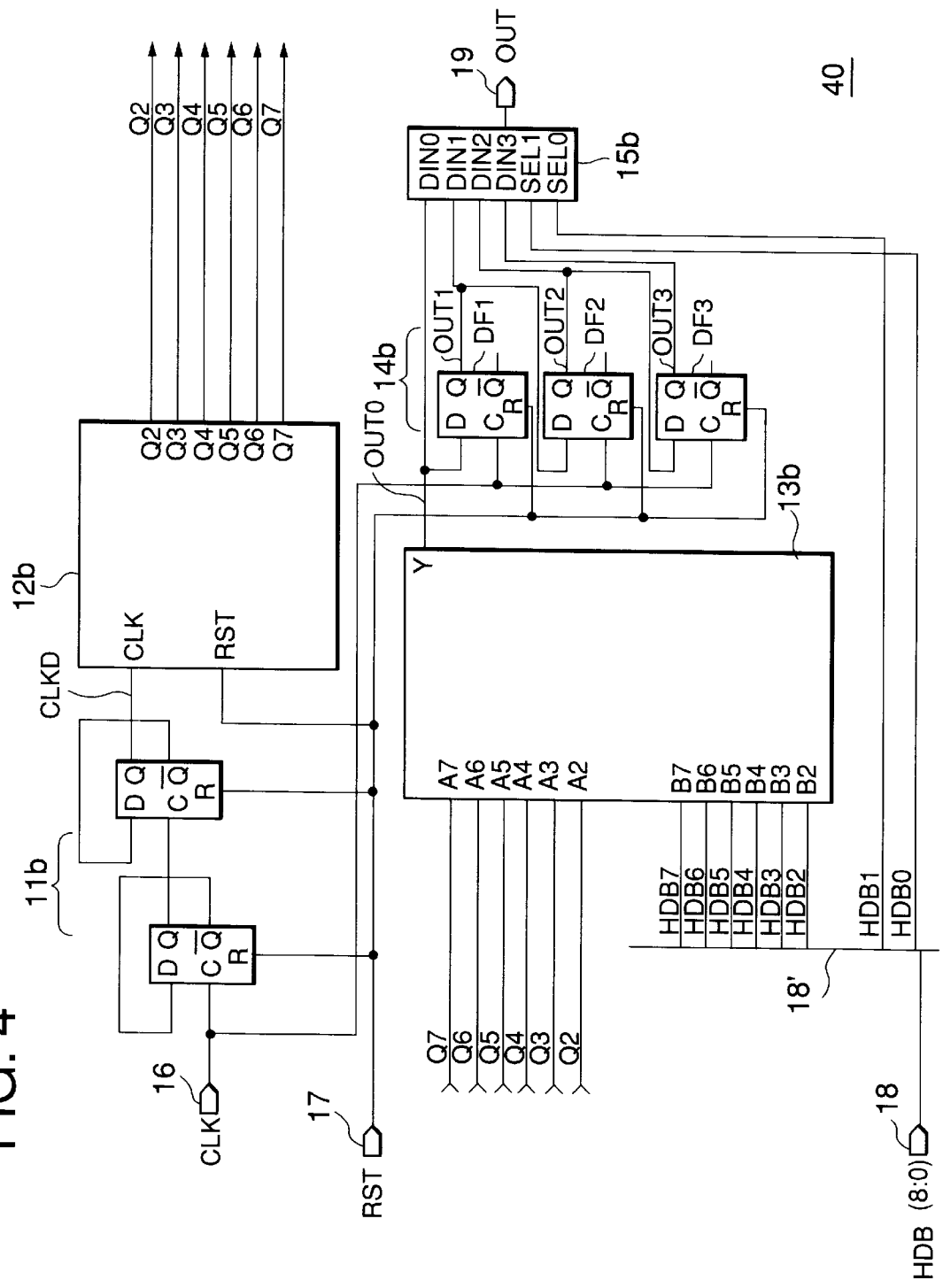
FIG. 4 is a circuit diagram showing a second embodiment of the present invention.

Next, a second embodiment of the present invention is described. The second embodiment is arranged as shown in FIG. 4. A counter 40 is a counter which can count up to eight bits as in the first embodiment, but supplies a frequency divided clock signal CLKD which is an original clock signal CLK divided into four to the counter circuit 12b. Therefore, externally set values HDB0–HDB7 are divided into two lower bits HDB0 and HDB1, and six upper bits HDB2–HDB7. In addition, since a shift register 14b is sufficient to have three stages, it is constituted by flip-flops DF1–DF3. Match detection signals OUT0–OUT3 output from these flip-flops DF1–DF3 are selected at a multiplexer 15b based on the values of lower bits HDB0 and HDB1 of the externally set value, and output as a count completion signal OUT.

In this embodiment, correspondence between the match detection signals OUT0–OUT3 and the lower bits HDB0 and HDB1 of the externally set value is as follows:

Select the match detection signal OUT0 when HDB1 and HDB0 are "00";
Select the match detection signal OUT1 when HDB1 and HDB0 are "01";
Select the match detection signal OUT2 when HDB1 and HDB0 are "10"; and
Select the match detection signal OUT3 when HDB1 and HDB0 are "11."

Figure 5:
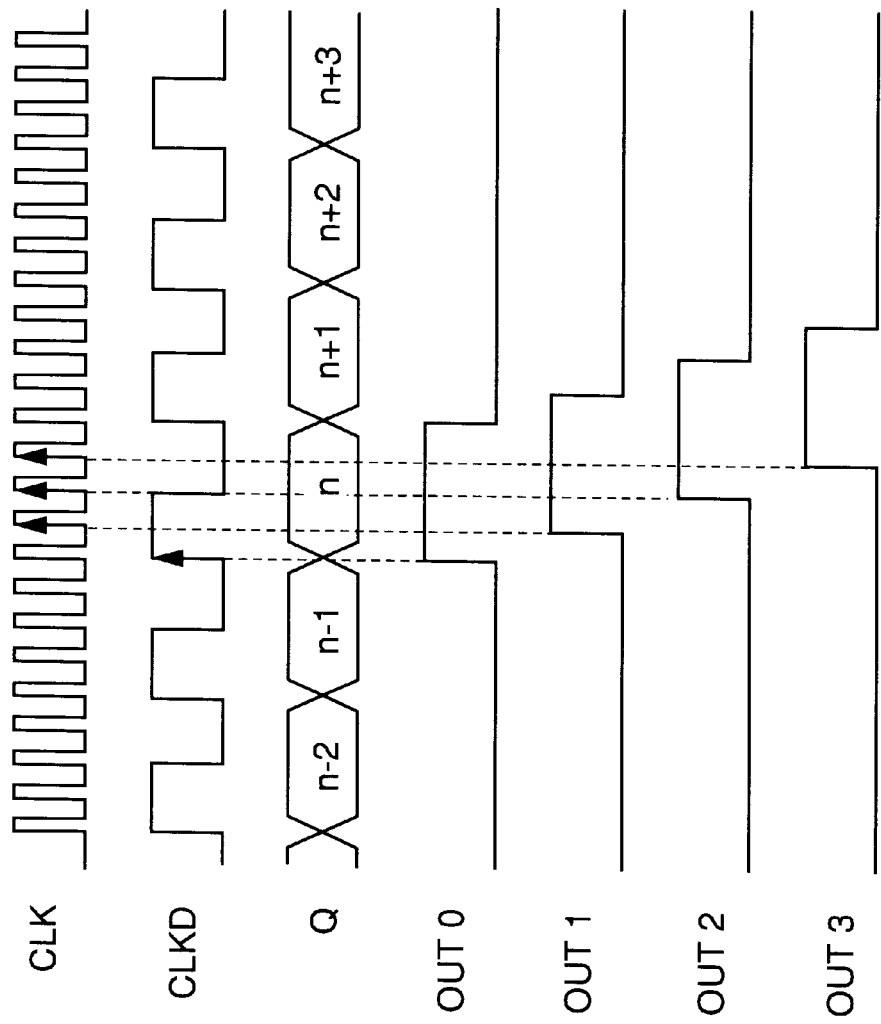
FIG. 5 is a timing chart showing operation of the second embodiment of the present invention.

FIG. 5 shows a timing chart. The counter circuit 12b of the embodiment counts up once every four original clock signals CLK. Therefore, the shift register 14b counts four original clocks to generate match detection signals OUT1–OUT3, and the multiplexer 15b compares them with the lower two bits HDB0 and HDB1 of the externally set value, and outputs a count completion signal OUT.

With the above arrangement, it can accommodate a clock signal higher than the first embodiment. Although, in this embodiment, the frequency divider circuit, the shift register and the multiplexer has slightly larger circuit scale and power consumption than the first embodiment, the counter circuit and the comparator circuit have smaller scale and power consumption. Thus, in the present invention, the circuit scale and power consumption are not significantly increased even if the supplied clock signal has high frequency.

As clearly seen from the above description, although the counter according to the present invention has a frequency divider, a shift register and a multiplexer in addition to the components of conventional counter shown in FIG. 6, scale of the counter circuit and the comparator circuit becomes smaller when the original clock signal has a higher frequency. Therefore, increase of circuit scale can be suppressed at a low level. In addition, since it is possible to operate the counter circuit at a lower frequency through frequency division of the original clock signal, the present invention is favorable in power consumption. That is, according to the present invention, it is possible to implement a counter which is excellent in the circuit scale and power consumption for a circuit in which the counter circuit shown in FIG. 8 or 9 is applied to the counter of FIG. 6.

What is claimed is:

1. A counter comprising a frequency divider receiving an input clock signal and dividing said input clock signal to output a divided clock signal, a divider means receiving an externally set value indicative of a predetermined number of bits and dividing said externally set value into a first externally set value represented by a first predetermined number of bits and a second externally set value represented by a second predetermined number of bits, a first counter circuit outputting a first count value represented by said first number of bits in synchronization with said divided clock signal, a first comparator comparing said first externally set value with said first count value and outputting a match detection signal when both match each other, and output means receiving said input clock signal and outputting said match detection signal as a count completion signal when said input clock signal in a number specified by said second externally set value is input after said match detection signal is output from said first comparator.

2. The counter as claimed in claim 1, wherein, when the number of frequency division by said frequency divider is d, said second number of bits is $\log_2 d$.

3. The counter as claimed in claim 1, wherein said output means comprises a second counter circuit outputting a second count value in synchronization with said input clock signal, and a second comparator receiving said match detection signal and outputting said match detection signal as said count completion signal when said second externally set value matches said second count value through comparison between them.

4. The counter as claimed in claim 3, wherein said second counter circuit is a shift register shifting said match detection signal in synchronization with said input clock signal and outputting the shifted output as said second count value.

5. The counter as claimed in claim 4, wherein the number of stage of said shift register is $2^l - 1$ when the second number of bit is l.

6. The counter as claimed in claim 4, wherein said second comparator is a multiplexer selecting said match detection signal or said shifted output based on said second externally set value and outputting it as said count completion signal.

7. A counter comprising a frequency divider receiving an input clock signal and dividing said input clock signal with the factorial of two to output a divided clock signal, divider means reeceiving an externally set value with a predetermined number of bits and dividing said externally set value into a first externally set value with a first predetermined number of bits and a second externally set value with a second predetermined number of bits, a first count comparator operating in synchronization with said divided clock signal and outputting a match detection signal when said input clock signals are input by the number of said first externally set value, and a second count comparator operating in synchronization with said input clock signal and for outputting a match detection signal as a count completion signal when said input clock signals are input by the number of said second externally set value after said first match signal is output from said first count comparator.

8. The counter as claimed in claim 7, wherein said first count comparator includes a first counter circuit which comprises a first flip-flop and a second flip-flop to which said divided clock signal is commonly input, and a gate circuit supplying output of said first flip-flop to said second flip-flop as a carry signal, and said second count comparator includes a second counter circuit which comprises a third flip-flop and a fourth flip-flop to which said input clock signal is commonly input, and a shift register receiving said match detection signal as data input.

9. The counter as claimed in claim 7, wherein, when the number of frequency division by said frequency divider circuit is d, said second number of bits is $\log_2 d$.

10. The counter as claimed in claim 8, wherein the number of stage of said shift register is $2^l - 1$ when the second number of bit is l.

* * * * *